United States Patent [19]

Moss et al.

[11] Patent Number: 4,664,743

[45] Date of Patent: May 12, 1987

[54] GROWTH OF SEMI-CONDUCTORS AND APPARATUS FOR USE THEREIN

[75] Inventors: Rodney H. Moss, Felixstowe; Paul C. Spurdens, Woodbridge, both of England

[73] Assignee: British Telecommunications plc, Great Britain

[21] Appl. No.: 672,231

[22] Filed: Nov. 16, 1984

[30] Foreign Application Priority Data

Aug. 21, 1984 [GB] United Kingdom ............... 8421162

[51] Int. Cl.⁴ ..................... C30B 25/12; C23C 28/00
[52] U.S. Cl. ................................ 156/613; 156/614; 148/DIG. 25; 118/719; 118/729; 118/730; 427/87; 427/255.5
[58] Field of Search ................. 156/611, 613, 614; 118/715, 719, 729, 730; 427/87, 255.2, 255.5; 148/DIG. 25

[56] References Cited

U.S. PATENT DOCUMENTS

| | | | |
|---|---|---|---|
| 3,424,629 | 1/1969 | Ernst et al. ........................ | 148/175 |
| 3,473,510 | 10/1969 | Sheng et al. ....................... | 118/719 |
| 3,637,434 | 1/1972 | Nakanuma et al. ................ | 156/611 |
| 3,785,853 | 1/1974 | Kirkman et al. ................... | 118/719 |
| 4,058,430 | 11/1977 | Suntola et al. ..................... | 156/611 |
| 4,261,808 | 4/1981 | Walter ................................ | 118/729 |
| 4,468,283 | 8/1984 | Ahmed ............................... | 156/611 |

FOREIGN PATENT DOCUMENTS

| | | |
|---|---|---|
| 71897 | 5/1982 | Japan ............................. 156/614 |
| 223317 | 12/1983 | Japan ............................. 156/611 |
| 502122 | 3/1971 | Switzerland . |
| 1077320 | 11/1967 | United Kingdom . |
| 1108414 | 4/1968 | United Kingdom . |
| 1110946 | 4/1968 | United Kingdom . |
| 1160162 | 7/1969 | United Kingdom . |
| 1559269 | 1/1980 | United Kingdom . |
| 2036087 | 6/1980 | United Kingdom . |
| 2142045 | 1/1985 | United Kingdom . |
| 2162367 | 1/1986 | United Kingdom . |

OTHER PUBLICATIONS

"A Simplified Technique for MOCVD of III-V Compounds" by A. K. Chatterjee et al., *Journal De Physique*, vol. 43, pp. C5-491 to 503 (Dec. 1982).

"Metallo-Organic Compounds" by Rodney H. Moss, *Chemistry in Britain*, pp. 733-737 (Sep. 1983).

"Insuring Consistent Doping Levels of Epitaxial Layers Grown on Batches of Wafers" by R. L. Bratter and A. K. Gaind—*IBM Technical Disclosure Bulltein*, vol. 15, No. 11, pp. 3550-3551, Apr. 1973.

"A New Technique for Vapor Phase Multilayer Epitaxy of III-V Compound Semiconductors" by M. Yoshida et al., Abstract 207, 152nd Electrochemical Society Meeting, Seattle, Washington Electrochemical Society (1978).

"A New Approach to MOCVD of Indium Phosphide and Gallium-Indium Arsenide" by R. H. Moss and J. S. Evans, *Journal of Crystal Growth*, vol. 55, pp. 129-134 (1981).

"Hydride Multi-barrel Reactors Suitable for Microwave and Optoelectronic (Ga, In) (As, P) Heterostructure Growth", by G. Beuchet et al., *Journal of Crystal Growth*, vol. 57, pp. 379-386 (1982).

"Low Pressure-MOCVD Growth of GaInAs-InP Heterojunction and Superlattices" by M. Razeghi et al., *J. Vac. Sci. Technol.*, vol. 1, No. 2, Apr.-Jun. 1983.

"MOVPE-Current Status for Optoelectronic Applications" by R. H. Moss et al., *British Telecon Technologies Journal*, vol. 2, No. 4, Sep. 1984.

"Crystal Growth and Properties of Binary, Ternary and Quaternary (In, Ga) (As, P) Alloys Grown by the Hydride Vapour-phase Epitaxy Technique" by G. H. Olsen and T. J. Zamerowski, Prog. *Crystal Growth Charact.*, vol. 2, pp. 309-375 (1979).

*Primary Examiner*—David L. Lacey
*Attorney, Agent, or Firm*—Nixon & Vanderhye

[57] ABSTRACT

A method for the growth of a semi-conductor material on a substrate by vapour phase epitaxy, comprises establishing a gas flow in each of a plurality of ducts, and moving the substrate, in a single plane of movement, from one duct to another. Suitable apparatus for use in the method comprises a plurality of ducts; apparatus for establishing a gas flow along each duct; a substrate support member, on which there may be a groove for the location of a substrate; and apparatus for moving, e.g. rotating, the support member. In use, the substrate is exposed sequentially to at least two of the gas flows, e.g. to grow GaInAs on InP.

23 Claims, 6 Drawing Figures

GROWTH OF SEMI-CONDUCTORS AND APPARATUS FOR USE THEREIN

The present invention relates to the growth of semi-conductors and to apparatus for use therein. While various vapour phase growth techniques are known for semi-conductors, e.g. vapour phase epitaxy (VPE), wherein an appropriate gas composition is passed over a substrate on which the growth occurs, this invention relates particularly to MOVPE (metal organic vapour phase epitaxy).

It is frequently necessary to employ two or more differing gas compositions sequentially to a substrate, e.g. when two or more distinct layers are to be grown. It may also be necessary even in the growing of a single semi-conductor layer on the substrate, e.g. for protection or etching of surfaces.

It is possible to achieve the sequential exposure of the substrate to differing gas compositions simply by changing the gas flows through a reactor zone in which the substrate is situated. However, this change-over technique does not offer very good control. In particular, the durations of exposure to each of the compositions or to (undefined) mixtures of the two compositions during the change-over period may be uncertain. This lack of control is especially serious when one or more of the layers to be grown is very thin, i.e. when the corresponding growth time is very short. Very thin layers are required, for example, in "quantum well" devices and in particular in quantum well lasers. Typically, the layer thicknesses involved in quantum well lasers are envisaged to be from 5 to 20 nm; see for example, Burt, Electronics Letters 19 (1983) 210–211.

Of course, more rapid change-over of gas compositions in a reactor may be achieved by the use of higher gas flow rates. The use of higher flow rates is believed to affect the crystal quality adversely, so that the advantage of the improved control of growth times is offset.

An alternative technique is to move the substrate physically from one gas flow to another. Moving the substrate is a convenient technique in liquid phase epitaxy (LPE), but we are not aware of any particularly convenient method in VPE. The methods in VPE, e.g. as described by Beuchet et al, J. Crystal Growth 57(2) (April 1982) 379–386, of which we are aware tend to be complicated and/or offer a high risk of cross-contamination of the gas flows, either directly or by carry-over with the moving substrate. By comparison with LPE, a "hot-wall" technique in which reactants, apparatus and substrate are at substantially the same, elevated temperature, MOVPE normally requires that the substrate only should be hot while other areas of the apparatus are relatively cool.

Previous descriptions of apparatus for the growth of semi-conductor materials by passing gas compositions over substrates include the articles by Moss and Evans, J. Crystal Growth 55 (1981) 129–134; Chatterjee et al, Journal de Physique 43 (1982) C5 491–503; and Olsen and Zamerowski, Progress in Crystal Growth and Characterisation 2 (1979) 309–375.

The preparation of quantum-well structures for compositions in the system Ga-In-P-As presents severe problems compared with those in the Al-Ga-As system, because of the need to achieve close lattice matching while retaining accurate control of the energy gap ($E_g$). In MOVPE growth, as disclosed by Moss et al, British Telecom. Tech. J. 2 (1984) 74, the greater complexity of the In precursor pyrolysis imposes an additional problem. To date, the only successful MOVPE growth of (Ga, In)As/InP superlattices has been achieved by Duchemin and co-workers (see J. Vec. Sci. Tech, 81 (1983) 262) who adopted a low pressure route for their preparation. This approach evidently alleviates some of the complexities associated with gas composition switching and eddy formation in the reaction chamber. However, there is a need to achieve fast and accurate switching, and is reflected in the designs of vent/run fast-switching gas manifolds which are emerging. In the latter, there is evidence of sorption/desorption effects in changing gas compositions, which suggests that this approach is limited and will depend on various factors, including dead space volume, surface areas in the gas-handling system, and the nature of the surface present.

According to a first aspect of the present invention, a method of vapour phase epitaxy is used for the growth of a semi-conductor material on a substrate, by establishing a gas flow in each of a plurality of ducts, and moving the substrate, in a single plane of movement, from one duct to another.

Apparatus according to the present invention, suitable for use in growing a semi-conductor material on a substrate, comprises:

a plurality of ducts;
means for establishing a gas flow along each duct;
a substrate support member; and
means for moving the support member in a single plane of movement and in a manner such that a substrate supported thereon can be exposed to gas flow in each duct.

Further, a method for the growth of a semi-conductor material on a substrate, according to the present invention, uses apparatus according to the invention and comprises the steps of:

(i) locating the substrate on the support member;
(ii) establishing a gas flow along each duct; and
(iii) exposing the substrate sequentially to at least two of the gas flows, by movement of the support member in one plane.

The present invention provides what we believe to be the simplest solution to the problems involved in MOVPE, and in using a cold-wall reactor, in which a substrate on a heated support must come into contact with different gas flows. Direct, linear (or curvilinear) movement between adjacent ducts provides a solution at once simple and effective.

The invention will be described with reference to two types of exemplifying apparatus, generally (but not necessarily) involving substantially vertical and substantially horizontal gas flow, respectively. It may be noted that the first type of apparatus and its use are described and claimed in British Patent Application No. 8414018.

One preferred characteristic of apparatus of the first type is that the gas flows are defined, in ducts essentially sector-shaped, by a tube and a relatively rotatable substrate support member within the tube. In this case, it is preferred that the support member is elongate, each gas flow impinges on a side surface of the elongate member at differing circumferential positions, and the apparatus includes means for relative rotation of the elongate member and the tube, thereby permitting the (curvilinear) movement of a substrate located on the said side surface from one gas flow to another. The side surface is preferably conical ("conical" as used herein is to be understood to include "frustoconical"), with gas flow being established by the relevant means in the direction of the broader end of the conical side surface.

Preferably, there are at least four, and most preferably four, gas flows. The support member may include a depression or recess (or other location means), more preferably a longitudinal groove on its side surface, for location of the substrate. There may be means for the location of two or more substrates at the same circumferential location but at different longitudinal locations.

One preferred characteristic of the use of apparatus of the second type is that the substrate is moved in a straight line from one duct to another; a further preferred feature is that the axes of the ducts and of the movement of the support member are both substantially horizontal and respectively orthogonal. One preferred characteristic of apparatus of the second type is that the ducts are of substantially rectangular section; another is that the support can be moved in a straight line; and a third is that the ducts are parallel, with a channel for the movement of the support member extending between and beyond the ducts, the axes of the ducts and channel being substantially orthogonal, and in which the height of the channel is substantially the same as that of the support member, so that gas flow over the support member is substantially non-turbulent. Again, the support member may include means for the location of a substrate, e.g. a recess within which a substrate may be positioned.

The invention will now be described by way of example with respect to the accompanying drawings, in which.

Figure 1:
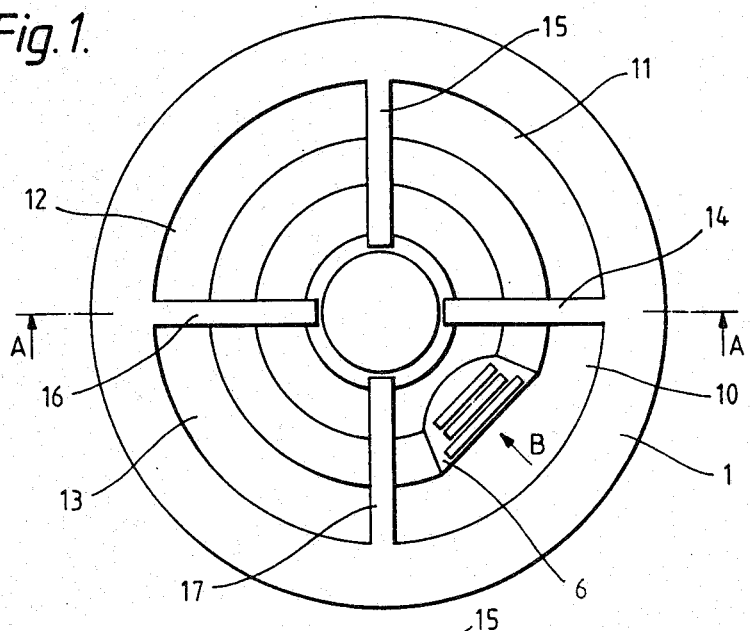
FIG. 1 is a plan view of an apparatus according to the invention.
Figure 1A:
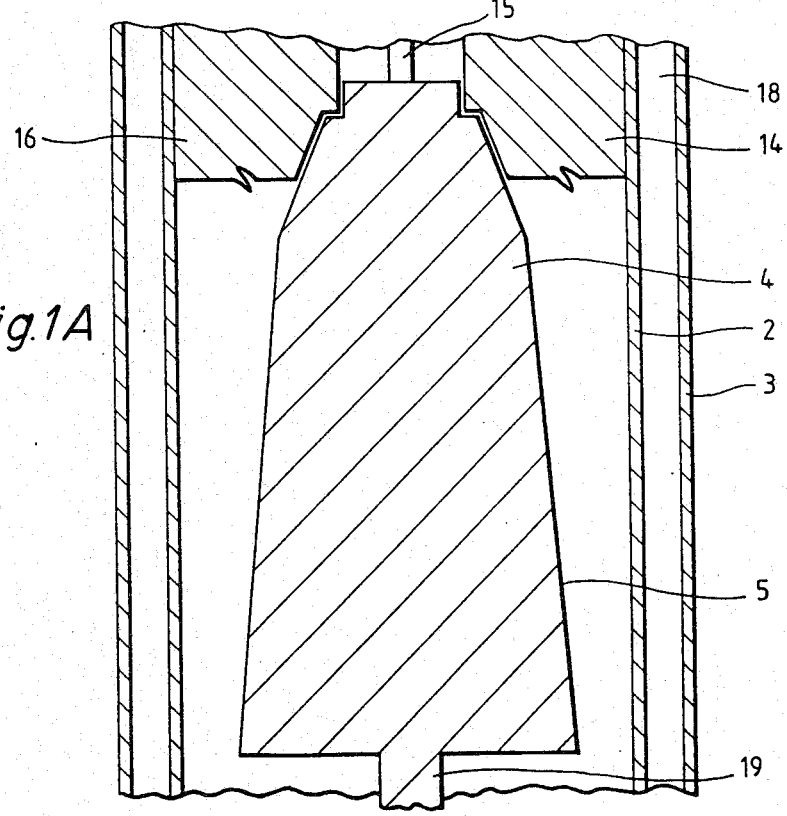
FIG. 1A is a cross-sectional view of the FIG. 1 embodiment taken along line A—A of FIG. 1.
Figure 2:
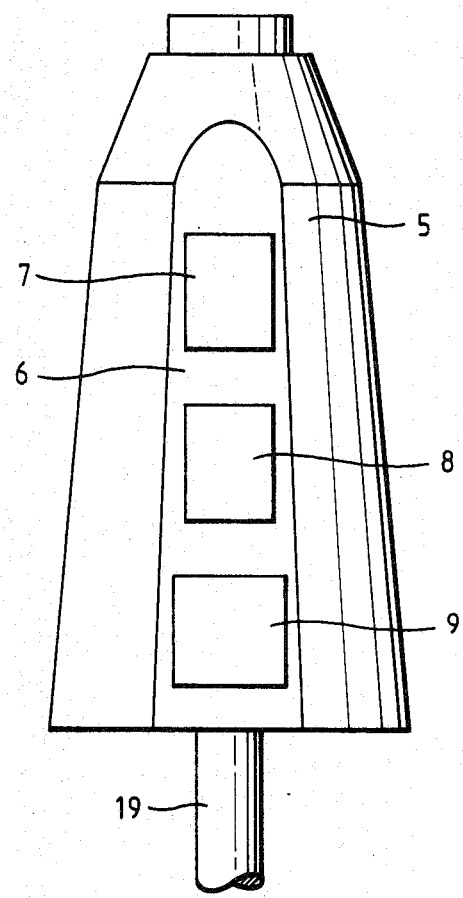
FIG. 2 is an elevation of the elongate member in FIG. 1 carrying three substrates, this elevation being in the direction of arrow B in FIG. 1.

FIGS. 1, 1A and 2 show a tube 1 (in the form of a water jacket) having inner and outer walls 2 and 3, respectively. An elongate member 4 includes a frustoconical side surface 5. The elongate member and the tube have a common vertical axis. Typically, the dimensions of the frustoconical surface 5 would be 44 mm at the narrow end and 60 mm at the broad end, the overall length being 90 mm.

Substrates 7, 8 and 9 are located on surface 5 by means of the shallow longitudinal groove 6 and appropriate protrusions or other formations (not shown) on the bottom or sides of the groove.

The apparatus is designed for the establishment of up to four distinct gas flows, each of these within quadrants 10, 11, 12 and 13, and directed downwards towards the broader end of the conical surface 5. The means for establishing these flows are not fully shown but include four similar fins 14, 15, 16 and 17 in the upper extension 18 of tube 1.

The substrates can be moved between the gas flows by rotation of the elongate member 4 about an axle 19.

The groove 6 is of constant depth, so that substrate 9 is at a greater distance from the axis of the elongate member than substrate 8 which is, in turn, at a greater distance than substrate 7. The substrates lie flat in the groove so that the normal to their faces is inclined to be slightly above the horizontal. This arrangement serves to reduce the effect of depletion of the gas flow by previous exposure to other parts of an individual substrate or other substrates. The placing of the substrates in a groove makes the establishment of non-turbulent flow over the substrates easier. The vertical orientation of the axes of the tube and elongate member minimizes effects due to convection.

Figure 3:
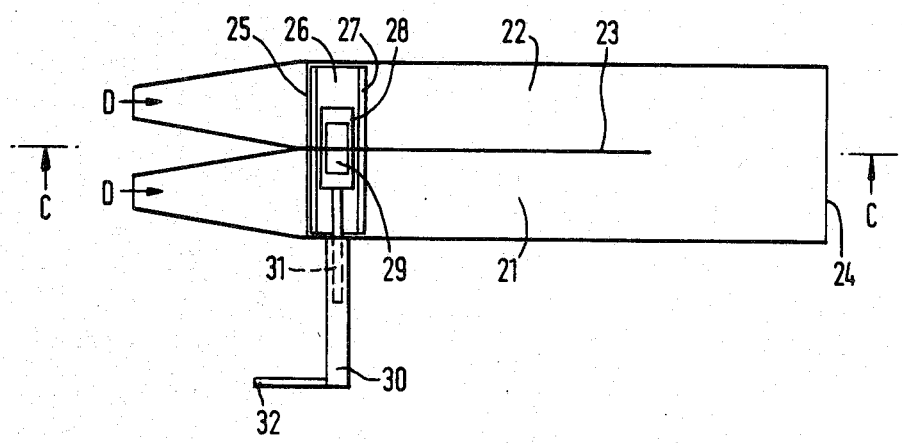
FIG. 3 is a schematic plan view (not to scale) of another embodiment of apparatus according to the present invention.

FIG. 3 shows apparatus, intended to be used with horizontal gas flow and substrate movement, comprising two ducts 21 and 22 each for the passage of gas (in the direction illustrated by the arrows D) tapered at their inlet ends. Beyond the tapers, the ducts 21 and 22 have a common wall 23, e.g. of silica, which terminates at a point allowing the gases to mix for their passage to waste, at a common duct outlet 24.

Figure 4:
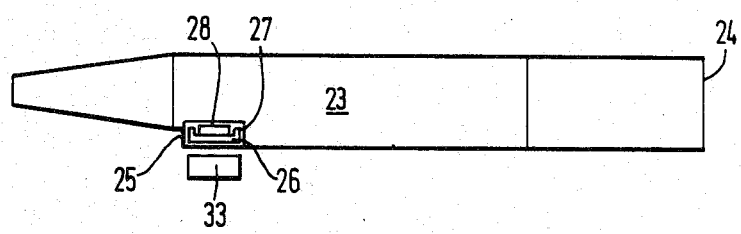
FIG. 4 is a sectional view, along the line C—C, of the apparatus shown in FIG. 3.

Referring now also to FIG. 4, the ducts have in their floors a step 25. The wall 23 and the step 25 together define a first rectangular aperture in which a block 26 is positioned. The upper face of the block is recessed along its entire length (the recess being defined by sidewalls 27) such that a substrate support member 28 can just pass through the second, smaller rectangular aperture defined by the recess and the wall 23. The support member 28 itself includes a recess within which a substrate can sit and lie substantially flush with the floors of the ducts on their inlet sides.

The second aperture is coaxial with a side-arm 30 which extends linearly, beyond the duct 21, at right angles to the direction of gas flows. The support member 28 is shown in passage between the gas ducts, and its movement is achieved by remote control of an arm 31 attached to the support, which can extend into the side-arm 30. For example, a sealed magnetic bar and silica rod can be used. An inlet 32 is provided for a gas such as hydrogen which can be used to purge the side-arm 30 and prevent diffusion of gas from duct 21 into the side-arm. A heater 33 is positioned beneath block 26, and this can be, for example, a resistively-heated block or an infra-red lamp.

A substrate can be positioned on, and removed from, the support member 28 through the gas outlet opening. In an alternative construction, the side-arm may be made sufficiently large to accommodate the movement of the support member outside the duct 21, for insertion and removal of a substrate (after isolation or shut-off of the gas flows), and also during heat-up.

The gas flow ducts 21 and 22 are suitably of rectangular, e.g. square, cross-section; suitable dimensions are 25 mm square. The block 26 may be, for example, of the order of 30 mm wide, 50 mm long and 7 mm thick, when the step 5 is 6 mm high. The recess may be 21 mm deep, to accommodate a substrate support member having a recess no more than 0.15 mm deep (for a corresponding thin substrate). Overall, the dimensions will be chosen so that the gas flow over the substrate is substantially non-turbulent. The gas flows in the respective ducts can be at rates such that there is substantially no gas interchange between the ducts through the aperture between them.

The apparatus described above may be used conveniently for the deposition of semi-conductor material by the MOVPE method which has been described elsewhere, e.g. in the papers by Moss et al and Chatterjee et al already referred to. In MOVPE, the metallic elements of a desired semi-conductor material are provided in the form of volatile organo-metallic compounds included in the gas flow. For example, indium may be provided in the form of a trialkyl such as In(CH$_3$)$_3$ or an adduct such as (CH$_3$)$_3$In.P(C$_2$H$_5$)$_3$; the use of a mixture of (CH$_3$)$_3$In.P(C$_2$H$_5$)$_3$ and PH$_3$ in H$_2$ is a convenient way of growing InP on a heated substrate.

The invention allows, for example, the growth of two layers of material on a substrate. The first material may be quaternary material Ga$_x$In$_{1-x}$As$_y$P$_{1-y}$ and the second may be InP (both with dopants, in general). Using apparatus as illustrated in FIGS. 1 and 2, the procedure might be as follows:

At room temperature, the substrate is loaded into position 7, 8 or 9, and the elongate member is rotated to the position for which the substrate lies centrally in quadrant 10 (as is in fact shown in FIG. 1).

Then, the following non-turbulent gas flows are established, at flow rates of about 1 meter/minute:

in quadrant 10, a stream of phosphine in hydrogen;

in quadrant 11, a stream of hydrogen chloride in hydrogen;

in quadrant 12, a stream of hydrogen carrying Ga, In, P and As (in the manner known for MOCVD); and in quadrant 13, a stream of hydrogen containing In and P and a dopant (in the manner known for MOCVD).

The substrate is now heated in quadrant 10 (i.e. in a protective atmosphere) by means of a heater on the elongate element and then moved to quadrant 11 so as to etch the surface clean. The substrate is then moved successively to quadrants 12 and 13 for the two depositions to occur, and it is finally moved back to the protective atmosphere of quadrant 10 for cool-down. The approximate circular symmetry of the tube/elongate member arrangement permits the sample to be moved rapidly, without excessive disruption of the gas flows or cross-contamination of the gas flows.

The use of the water jacket in the above procedure is known for MOCVD.

The procedure described above can be extended to the sequential exposure of a substrate to more than four different gas compositions. This is possible because, at any given time, the gas composition may be changed in any quadrant other than that in which the substrate is then situated. Likewise, the sequential exposure of a substrate to four different gas compositions could be achieved in accordance with the present invention by the use of apparatus permitting the simultaneous establishment of only two or three gas flows. However, it is believed that apparatus as shown in FIGS. 1 and 2, permitting the simultaneous establishment of just four gas flows, represents a particularly good combination of flexibility and ease of operation.

If it is particularly important to avoid cross-contamination of two particular gas flows, it is possible to use the apparatus shown in FIGS. 1 and 2 to advantage, by putting the two particular flows in opposite quadrants (say, 10 and 12) and putting two buffer flows, e.g. of pure hydrogen, in the quadrants 11 and 13.

The apparatus illustrated in FIGS. 3 and 4 can be simply adapted to the use of more than two gas flows, in more than two ducts. For example, sequences of gas flows and coating steps, with appropriate movement of the substrate, may be as described above.

Even when using only two gas flows, as in use of apparatus illustrated in FIGS. 3 and 4 of the accompanying drawings, oscillation of a substrate between the two flows enables a series of layers to be produced. More generally, it is possible to alter the gas composition in one zone, while a layer is being deposited in another. This approach makes it unnecessary to design complicated gas switching equipment, and eliminates problems of composition transients caused by adsorption/desorption of the reactants on the pipework and reactor walls when changing from one composition to another.

A further, clear advantage of using the principle behind the present invention, i.e. movement of the substrate, is that it makes growth independent of the presence of eddies in the reactor system, provided that they do not interfere with the decomposition process. Sorption/desorption effects experienced on changing partial pressures similarly become unimportant, and do not detract from the sharpness of the interfaces achieved. In fact, the only limiting effects will be due to a negligible amount of residual gas near to the substrate surface, which will be transferred with it on moving it to the new gas stream, and a slight perturbation of the gas flows at the moment of transfer. Both are small effects which should disturb growth to an extent appreciably less than 1 atomic layer in thickness.

The method of the invention can be operated under atmospheric pressure.

The following Example illustrates the invention.

EXAMPLE

Apparatus of the type illustrated in FIGS. 3 and 4 of the accompanying drawings was used, the two gas channels respectively providing the growth of InP and GaInAs. The molybdenum support member, controlled as suggested above by remote magnetic control, was designed to have a small thermal mass compared with a graphite block, and the entire substrate assembly was heated resistively using a platinum-wound flat-bed heater.

The desired gas phase compositions were established first while the gases were by-passed to waste. The InP substrate was heated in PH$_3$ to the growth temperature of 650° C. and the InMe$_3$.PEt$_3$ adduct was then introduced into duct 21; an InP buffer layer was grown. The gas stream for GaInAs was introduced into duct 22 and allowed to stabilize while the buffer layer grew. When the required thickness of layer had been deposited, the substrate was moved rapidly into duct 22 where the GaInAs was deposited.

In this way, a series of structures consisting of GaInAs on an InP buffer layer was deposited on an InP substrate, and assessed by double-crystal X-ray diffraction, photoluminescence (PL) and electrochemical profiling of carrier concentration. There is evidence (as yet unpublished) that the peak widths at half-height of the double crystal X-ray rocking curve is dependent upon the crystal quality of the epitaxial layer being measured, as well as the degree of lattice mismatch or bowing of the wafers, and confirmed by transmission electron microscopy (TEM) studies of GaInAs/InP hetero-junction interfaces. Using the growth technique described above, the peak half-widths for GaInAs which were found were much narrower than the inventors had been able to achieve by other techniques. The following Table shows half-widths obtained for (Ga,In)As epilayers on InP substrates, using different procedures.

| Procedure | | X-ray line-width (arc sec) |
|---|---|---|
| Manual operation of gas valves (without fast switching) | | c. 1000 |
| Manually operated vent/run switching | | 400–800 |
| Manually operated vent/run | | 130–170 |
| Automatic fast switching | with InP | 50–150 |
| Substrate transfer | buffer layer | 20–60 |

It can be seen from the data (and also from rocking curves) that, by moving the substrate from one stabilized gas stream to another, there is a significant improvement in the sharpness of the X-ray peak and hence in crystal quality of the epitaxial layer. The lowest achieved half-width of 22 arc secs corresponds to the predicted theoretical limit for GaInAs on InP.

Layers of good surface morphology were obtained and were found to be n-type in the low $10^{16}$ cm$^{-3}$ range. This doping level was found to be very sensitive to substrate and reactor cleaning procedures and is not considered to be necessarily due to source material purity.

Examination by PL of the layers showed an increase in luminescent intensity as the crystal quality improved, some layers having an intensity better than a good LPE standard of similar thickness and doping level. It was observed that the luminescence of GaInAs was enhanced by overgrowing the layer with InP; it is believed that this is due to the presence of surface states which causes non-radiative recombination in uncapped layers. Hayashi and Panish, J. Apps. Phys. 41 (1970) 150–183, have reported that a similar effect has been observed in GaAs.

Figure 5:
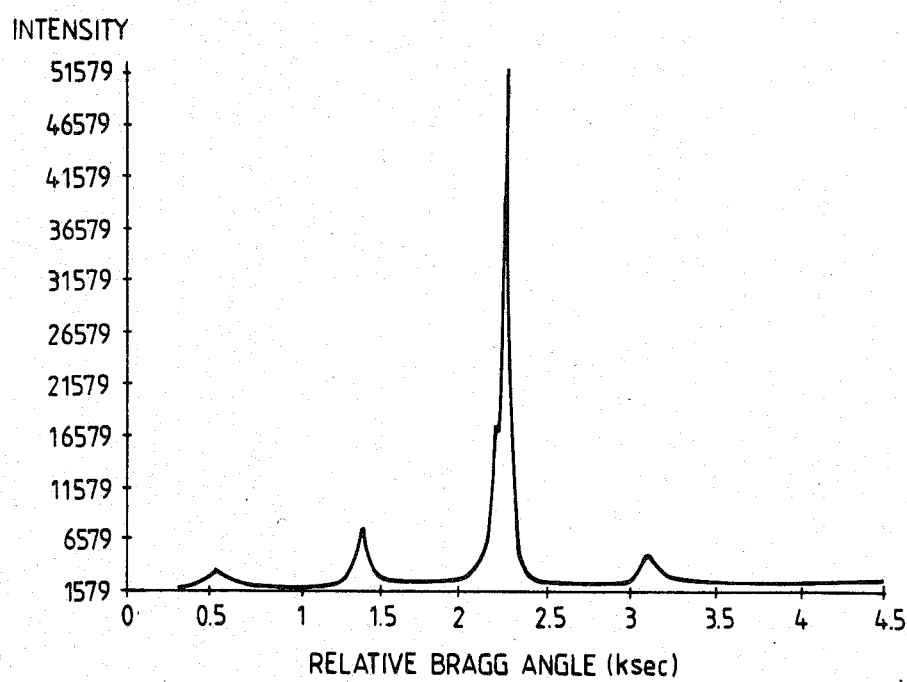
FIG. 5 is an X-ray double crystal diffraction scan of a product produced by the method of the invention.

Having established that good quality hetero-junctions could be obtained by this method, some superlattice structures were grown. A superlattice consisting of 100 pairs of alternating layers of GaInAs lattice-matched to InP was deposited. The growth time for each individual layer was 30 sec and the periodicity was found by double crystal X-ray diffraction to be 17 nm. The diffraction pattern showing the satellite peaks due to the superlattice is given in FIG. 5; the fact that these lines can be seen is indicative of the regularity of the structure.

The PL intensity from the superlattice was high, with a peak wavelength of 1.55 μm. There was some variation of the wavelength over the slice, indicating a non-uniformity of growth rate, which should be overcome by optimisation of the reactor geometry for growth uniformity over large areas. The shift in wavelength from 1.65 μm for a thick single GaInAs layer indicates the layer thicknesses of the quantum wells to be about 10 nm. Cathodoluminescence of the wafer gave a peak wavelength of 1.55 μm at room temperature, and 1.5 μm at liquid helium temperature. The intensity was high, and at low temperatures a peak due to a shallow acceptor, possibly zinc or carbon, was found. This has been observed previously in MOVPE-grown InP and GaInAs (in work to be published).

A preliminary investigation of a cross-section of the wafer by TEM confirmed the periodicity and dimensions of the superlattice. No defects were observed in the structure.

Multi-quantum well lasers (10 wells of $Ga_{0.47}In_{0.53}As$ in a matrix of InP, 10 nm thick) operating at 1.55 μm have been prepared from material grown by this technique. In addition, layer thicknesses down to 2.5 nm (as measured by TEM) have been obtained.

We claim:

1. A method of growing very thin layers of semi-conductor material on the order of 20 nm or less in at least first and second ducts, said first and second ducts sharing an interface wall which extends substantially the entire length of said ducts, said interface wall having an aperture therein, said method comprising:
    (a) establishing, with a gas having metallic elements of a desired semi-conductor, material, vapour phase epitaxy conditions in said first duct containing a substrate and thereby growing a first layer of semi-conductor onto said substrate in said first duct;
    (b) during said growth of said first layer, establishing in said second duct conditions suitable for vapour phase epitaxy of a second type, said conditions being suitable for the growth of a second layer of semi-conductor in contact with said first layer;
    (c) maintaining said substrate stationary in said first duct during substantially all the growth of said first layer;
    (d) rapidly moving the substrate, before said first layer exceeds a 20 nm thickness, from said first duct through said aperture in said interface wall to said second duct and growing a second layer of semi-conductor onto said first layer in said second duct, whereby an abrupt interface between said two layers is created; and
    (e) returning the substrate to said first duct, for growth of a further layer or cool down.

2. A method according to claim 1, which comprises moving the substrate only linearly from said first duct to said second duct.

3. A method according to claim 2, in which each of the ducts has an associated longitudinal axis and wherein the substrate is supported on a movable support member and wherein the axes of the ducts and of the movement of the support member are both substantially horizontal and respectively orthogonal.

4. A method according to claim 2, in which each of the ducts has an associated axis and wherein the substrate is supported on a movable substrate member and wherein the axis of the ducts is substantially vertical and the axis of movement of the support member is substantially horizontal.

5. A method according to claim 1, wherein said moving step comprises rotating said substrate about an axis common to each of said ducts.

6. A method of growing very thin layers of semi-conductor material on the order of 20 nm or less, in at least first and second ducts, said first and second ducts having a common wall structure therebetween which extends substantially the entire length of said ducts, said common wall structure having an aperture therein, wherein the method comprises;
    (a) establishing, with a gas having metallic elements of a desired semi-conductor material, vapour phase epitaxy conditions in said first duct containing a substrate and thereby growing a first layer of semi-conductor onto said substrate in said first duct;
    (b) during said growth of said first layer, establishing in said second duct conditions suitable for vapour phase epitaxy, said conditions being suitable for the growth of a second layer of semi-conductor in contact with said first layer;
    (c) maintaining said substrate stationary in said first duct during substantially all the growth of said first layer;

(d) rapidly moving the substrate, before said first layer exceeds a 20 nm thickness from said first duct to said second duct through said aperture in said common wall structure to a position therewithin and growing a second layer of semi-conductor onto said first layer in said second duct, whereby an interface between said two layers is created;

(e) maintaining said substrate stationary in said second duct during substantially all the growth of said second layer; and (f) returning the substrate to said first duct for growth of a further layer or cool down.

7. A method according to claim 6, in which each of the ducts has a longitudinal axis and wherein the substrate is supported on a movable support member and wherein the axis of the ducts and of the movement of the support member are both substantially horizontal and respectively orthogonal.

8. A method of growing a quantum well device having very thin semi-conductor layers on the order of 20 nm or less in thickness by vapour phase epitaxy in at least first and second ducts, said first and second ducts sharing a side wall which extends substantially the entire length of said ducts, and which has an aperture therein, said method comprising:

(a) flowing first vapour phase epitaxy reaction gases horizontally over the surface of a heated stationary semiconductor substrate disposed within the first duct having horizontally extending axis and side walls to thereby grow a first layer of semi-conductor onto said substrate;

(b) simultaneously flowing second vapour phase epitaxy reaction gases horizontally within said second duct also having horizontally extending axis and side walls to establish conditions suitable for growth of a second layer;

(c) maintaining said substrate stationary in the first duct during substantially all the growth of said first layer;

(d) abruptly moving said heated substrate, before a first semi-conductor layer grown in the first duct exceeds a thickness of 20 nm, transversely with respect to the shared side wall of said first and second ducts and through said aperture from said first duct to said second duct to effect a transition between substrate exposure to said first and second epitaxy reaction gases;

(e) growing a second layer of semi-conductor material onto said first layer in said second duct and maintaining said substrate stationary in the second duct during substantially all the growth of said second layer; and (f) oscillating the substrate between said first duct and said second duct for growth of further layers of said device.

9. A method according to claim 8, in which each of the ducts has an associated axis and wherein the axis of the ducts is substantially vertical and the movement of the support member is substantially horizontal.

10. A method according to claim 8, wherein said moving step comprises moving said substrate linearly only.

11. Apparatus for growing very thin layers of semi-conductor material on the order of 20 nm or less in thickness onto a substrate by vapour phase epitaxy, said apparatus comprising:
a plurality of ducts;
an interface member between said ducts extending substantially the entire length of said ducts, said interface member having a channel therein;
a substrate support member; and
means for rapidly moving the support member from one stationary position in one of said ducts to another stationary position in another of said ducts through said channel in a manner such that a substrate supported thereon can be successively exposed to gas flow in each of said ducts, such that a semi-conductor material layer is grown by vapour-phase epitaxy on the substrate which is no more than 20 nm in thickness from each successive gas flow, said means for moving including means for returning said support from one of said plurality of ducts to another of said ducts.

12. Apparatus according to claim 11, in which the ducts are of rectangular cross-section.

13. Apparatus according to claim 12, wherein said means for moving the support member is constructed so as to move said support member only in a straight line.

14. Apparatus according to claim 13, wherein said plurality of ducts are disposed as parallel ducts and including a channel for movement of the support member extending between and beyond the ducts, axes of the ducts and the channel being substantially orthogonal, and in which the height of the channel is substantially the same as that of the support member, so that gas flow over the support member is substantially non-turbulent.

15. Apparatus according to claim 11, in which the plurality of ducts is defined by a tube and the support member which is elongate and relatively rotatable within the tube is positioned such, that the gas flows within each of the ducts can impinge on a side surface of the support member at different circumferential locations within said tube.

16. Apparatus according to claim 15, in which the side surface has a broader end and is substantially conical.

17. Apparatus according to claim 16, in which said plurality of ducts comprises at least four ducts.

18. Apparatus according to claim 15, in which said plurality of ducts comprises at least four ducts.

19. Apparatus according to claim 15, which comprises means for the location of two or more substrates at the same circumferential locations on said side surface but at different longitudinal locations.

20. Apparatus according to claim 11, in which the support member includes a depression or recess within which a substrate can be positioned.

21. Apparatus including at least a first and second duct and a heated substrate support for growing very thin semi-conductor layers on the order of 20 nm or less in thickness by vapour phase expitaxy onto a substrate, said apparatus comprising:
said first duct having a horizontally extending axis for having a first vapour phase expitaxy reaction gas flow horizontally therealong for growing a first layer of semi-conductor material onto a substrate;
said second duct having a horizontally extending axis for having a second vapour phase epitaxy reaction gas flow horizontally therealong for growing a second layer of semi-conductor material onto the first layer;
an interface member shared by said first and second ducts, said interface member extending substantially the entire length of said first and second ducts, said interface member having an aperture therein;

means for rapidly moving said heated substrate, before said first layer exceeds a 20 nm thickness, from a first stationary position in said first duct to a second stationary position in said second duct through said aperture, said motion being transverse to said interface member of said ducts, said means for abruptly moving including means for returning said support from said second duct to said first duct.

22. Apparatus as in claim 21 wherein said first and second ducts are sector-shaped and wherein said support comprises a coaxial rotatable member within said ducts and includes a recessed portion upon which a semi-conductor substrate may be mounted.

23. Apparatus as in claim 22 wherein said recessed portion is disposed at an incline with respect to said gas flow so as to expose each area of the substrate to a fresh portion of the gas flow.

* * * * *